(12) United States Patent
Clark (10) Patent No.: US 7,651,961 B2
(45) Date of Patent: Jan. 26, 2010

(54) METHOD FOR FORMING STRAINED SILICON NITRIDE FILMS AND A DEVICE CONTAINING SUCH FILMS

(75) Inventor: Robert D. Clark, Schenectady, NY (US)

(73) Assignee: Tokyo Electron Limited, Tokyo (JP)

( * ) Notice: Subject to any disclaimer, the term of this patent is extended or adjusted under 35 U.S.C. 154(b) by 124 days.

(21) Appl. No.: 11/730,288

(22) Filed: Mar. 30, 2007

(65) Prior Publication Data

US 2008/0242116 A1 Oct. 2, 2008

(51) Int. Cl.
*H01L 21/31* (2006.01)
*H01L 21/469* (2006.01)

(52) U.S. Cl. ............... 438/792; 438/793; 257/E21.478; 257/E21.639; 427/255.27

(58) Field of Classification Search ............... 438/792, 438/793; 257/E21.478, E21.493, E21.639, 257/E21.625, E21.576, E21.54; 427/255.27, 427/255.395, 255.37
See application file for complete search history.

(56) References Cited

U.S. PATENT DOCUMENTS

| | | | | |
|---|---|---|---|---|
| 4,772,489 A | * | 9/1988 | Shikata | ........................ 438/779 |
| 2005/0170104 A1 | * | 8/2005 | Jung et al. | ................... 427/569 |
| 2006/0105106 A1 | * | 5/2006 | Balseanu et al. | .......... 427/248.1 |
| 2006/0183279 A1 | | 8/2006 | Chen et al. | ................... 438/199 |
| 2006/0269692 A1 | | 11/2006 | Balseanu et al. | ............ 427/569 |
| 2006/0270217 A1 | | 11/2006 | Balseanu et al. | ............ 438/653 |
| 2007/0030568 A1 | * | 2/2007 | Ohmi et al. | ................... 359/584 |
| 2007/0232082 A1 | * | 10/2007 | Balseanu et al. | ............ 438/789 |
| 2007/0254492 A1 | * | 11/2007 | Baer et al. | ................... 438/778 |

OTHER PUBLICATIONS

International Preliminary Report on Patentability and Written Opinion(Aug. 1, 2008).*

* cited by examiner

*Primary Examiner*—Caridad M Everhart
(74) *Attorney, Agent, or Firm*—Oblon, Spivak, McClelland, Maier & Neustadt, L.L.P.

(57) ABSTRACT

A method for forming a strained SiN film and a semiconductor device containing the strained SiN film. The method includes exposing the substrate to a gas including a silicon precursor, exposing the substrate to a gas containing a nitrogen precursor activated by a plasma source at a first level of plasma power and configured to react with the silicon precursor with a first reactivity characteristic, and exposing the substrate to a gas containing the nitrogen precursor activated by the plasma source at a second level of plasma power different from the first level and configured to react with the silicon precursor with a second reactivity characteristic such that a property of the silicon nitride film formed on the substrate changes to provide the strained silicon nitride film.

27 Claims, 7 Drawing Sheets

METHOD FOR FORMING STRAINED SILICON NITRIDE FILMS AND A DEVICE CONTAINING SUCH FILMS

CROSS-REFERENCE TO RELATED APPLICATIONS

This application is related to co-pending U.S. patent application Ser. No. 11/730,342, entitled "STRAINED METAL NITRIDE FILMS AND METHOD OF FORMING," filed on even date herewith; co-pending U.S. patent application Ser. No. 11/730,340, entitled "STRAINED METAL NITRIDE FILMS AND METHOD OF FORMING," filed on even date herewith; co-pending U.S. patent application Ser. No. 11/730,334, entitled "STRAINED METAL SILICON NITRIDE FILMS AND METHOD OF FORMING," filed on even date herewith; co-pending U.S. patent application Ser. No. 11/730,343, entitled "STRAINED METAL SILICON NITRIDE FILMS AND METHOD OF FORMING," filed on even date herewith, and co-pending U.S. patent application Ser. No. 11/529,380, entitled "A METHOD OF FORMING STRAINED SILICON NITRIDE FILMS AND A DEVICE CONTAINING SUCH FILMS," filed on Sep. 29, 2006. The entire contents of these applications are herein incorporated by reference in their entirety.

FIELD OF THE INVENTION

The present invention relates to semiconductor processing, and more particularly to methods of forming strained silicon nitride films (SiN) and semiconductor devices containing the strained silicon nitride films.

BACKGROUND OF THE INVENTION

Nitride-based films are widely used in semiconductor devices and ultra-large-scale integrated circuits. For example, nitride films have been widely used in semiconductor devices as a diffusion barrier for dopants, as an etch-stop film during etching of fine features and as a final passivation film for encapsulation of fabricated devices, among many other uses. Nitride films can be deposited at low pressure or at atmospheric pressure using a variety of processing systems and process gases. These processing systems can perform, for example, thermal chemical vapor deposition (TCVD), plasma-enhanced chemical vapor deposition (PECVD), or remote-PECVD.

Recent innovations to improve complementary metal oxide semiconductor (CMOS) transistor performance have created an industry need for strained ceramic layers compatible with current ultra-large scale integration (ULSI) integration techniques. In particular, channel carrier mobility for negative metal oxide semiconductor (NMOS) transistors can be increased through introduction of tensile uniaxial or biaxial strain on a channel region of the MOS transistor. Similarly, compressively strained films can be used to realize an enhancement in channel carrier mobility for positive metal oxide semiconductor (PMOS) transistors.

Conventionally, strained films have been formed by post processing of films that are compatible with existing fabrication processes. In the case of strained SiN films, for example, a SiN film is formed to a desired thickness, and then treated with ultra violet light to alter the density in a surface region of the film thereby producing the strain. Alternatively, the deposited SiN film can be treated with oxygen containing gases that replace some N in the film with O, thereby producing strain. The present inventors have recognized several problems with these conventional methods for forming strained films.

First, post processing of the deposited film increases production steps thereby reducing throughput, and may require expensive special purpose tooling. In addition, post processing of the deposited film primarily affects the film surface, which limits control of the strain amount and makes some deep treatment processes unacceptably long. Finally, conventional processes deposit the initial film by a CVD process, which can have unacceptable thickness and conformality control for many small feature manufacturing processes now in practice.

SUMMARY OF THE INVENTION

Thus, one aspect of the invention is to reduce or eliminate one or more of the above-described or other problems associated with providing strained SiN layers.

Another aspect of the invention is to produce strain in the SiN film during forming of the film rather than by post processing. These and/or other aspects of the invention may be provided by any of the embodiments of the present invention.

According to an embodiment of the invention, the method includes exposing the substrate to a gas containing a silicon precursor, exposing the substrate to a gas containing a nitrogen precursor activated by a plasma source at a first level of plasma power and configured to react with the silicon precursor with a first reactivity characteristic, and exposing the substrate to a gas containing the nitrogen precursor activated by the plasma source at a second level of plasma power different from the first level and configured to react with the silicon precursor with a second reactivity characteristic such that a property of the SiN film formed on the substrate changes to provide the strained SiN film.

According to one embodiment of the invention, the method includes a) exposing the substrate to a gas pulse comprising the silicon precursor; b) exposing the substrate to a gas pulse comprising the nitrogen precursor activated by the plasma source at the first level of plasma power; c) exposing the substrate to a gas pulse comprising the silicon precursor; d) exposing the substrate to a gas pulse comprising the nitrogen precursor activated by the plasma source at the second level of plasma power; and e) repeating steps a)-d) a predetermined number of times.

BRIEF DESCRIPTION OF THE DRAWINGS

A more complete appreciation of the present invention and many attendant advantages thereof will be readily obtained as the same becomes better understood by reference to the following detailed description when considered in connection with the accompanying drawings, wherein.

DETAILED DESCRIPTION OF SEVERAL EMBODIMENTS

Embodiments of the invention describe processing methods to deposit strained SiN films in a process chamber. According to embodiments of the invention, a difference in reactivity of a nitrogen precursor towards a silicon precursor is utilized to deposit SiN films having a density gradient across the film thickness. A difference in reactivity is achieved by varying plasma activation of the nitrogen precursor during processing. For example, the reactivity may be controlled by the type of plasma activation and the level of plasma power used for the activation. According to embodiments of the invention, plasma activation may be accomplished using a direct plasma source within the process chamber or using a remote plasma source.

For example, the plasma activation may be utilized to vary the SiN deposition rate and film density. In some cases this difference in density may be further affected by changing the silicon precursor, changing the nitrogen precursor and/or changing other processing conditions. Variations in density across the thickness of an amorphous film such as SiN will result in SiN film strain due to variations in coefficient of thermal expansion created across the SiN film. The films can be tensile-strained and/or compressive-strained.

In one example, embodiments of the invention may be used to produce strain on a channel region of a CMOS transistor, as noted in the Background section above. Other embodiments of the invention may be utilized for forming a strained SiN film located between materials with very different coefficients of thermal expansion, in order to increase adhesion between the materials or to decrease the possibility of delamination during thermal cycling. More specifically, a strained SiN film disposed between different materials can be engineered according to embodiments of the invention such that the film contacting the first material has a first density compatible with the first material, but is density graded to transition to a second density compatible with the second material at a contact region of the second material.

Embodiments of the invention utilize plasma enhanced atomic layer deposition (PEALD), plasma enhanced CVD (PECVD), or pulsed PECVD methods for depositing strained SiN films. These deposition methods are well known methods for depositing a wide variety of materials. PEALD is a PECVD related film deposition method that uses sequential saturative surface reactions. In PEALD, pulses of the gaseous precursors are alternately exposed to the substrate. In PECVD, an uninterrupted flow of the gaseous precursors is exposed to the substrate, and in pulsed PECVD, the flow of one or more gaseous precursor(s) is periodically interrupted during the film deposition. In PEALD, PECVD, and pulsed PECVD, plasma excitation is utilized during at least a portion of the deposition process. This allows for varying the processing conditions during the film deposition. In one example, a level of plasma power used to activate a nitrogen precursor (e.g., $N_2$, ammonia ($NH_3$), or hydrazine ($N_2H_4$)) gas can be varied during PEALD, PECVD, or pulsed PECVD processing. In another example, a dilution gas may be used in combination with varying a level of plasma power to affect reactivity.

As used herein, SiN films refer to films containing silicon (Si) and nitrogen (N) as the major elements, where the elemental composition of the SiN films can be varied over wide ranges of atomic concentrations for Si and N. Furthermore, the SiN films may contain impurities such as carbon (C), oxygen (O), chlorine (Cl), and hydrogen (H), that may become incorporated into the SiN films during the processing or during substrate transfer. The terms "film" and "layer" are used interchangeably herein to refer to a material deposited or formed on a substrate, Examples of silicon precursors include, but are not limited to, silane ($SiH_4$), disilane ($Si_2H_6$), monochlorosilane (Si-$ClH_3$), dichlorosilane ($SiH_2Cl_2$), trichlorosilane ($SiHCl_3$), hexachlorodisilane ($Si_2Cl_6$), diethylsilane, and alkylaminosilane compounds. Examples of alkylaminosilane compounds include, but are not limited to, di-isopropylaminosilane ($H_3Si$ ($NiPr_2$)), bis(tert-butylamino)silane (($C_4H_9(H)N)_2SiH_2$), tetrakis(dimethylamino)silane ($Si(NMe_2)_4$), tetrakis(ethylmethylamino)silane ($Si(NEtMe)_4$), tetrakis(diethylamino) silane ($Si(NEt_2)_4$), tris(dimethylamino)silane ($HSi(NMe_2)_3$), tris(ethylmethylamino)silane ($HSi(NEtMe)_3$), tris(diethylamino)silane ($HSi(NEt_2)_3$), and tris(dimethylhydrazino)silane ($HSi(N(H)NMe_2)_3$).

Examples of nitrogen precursors include, but are not limited to, $N_2$, $NH_3$, $N_2H_4$, and $C_1$-$C_{10}$ alkylhydrazine compounds. Common $C_1$ and $C_2$ alkylhydrazine compounds include monomethyl-hydrazine ($MeNHNH_2$), 1,1-dimethylhydrazine ($Me_2NNH_2$), and 1,2-dimethyl-hydrazine (MeNHNHMe).

Figure 1A:
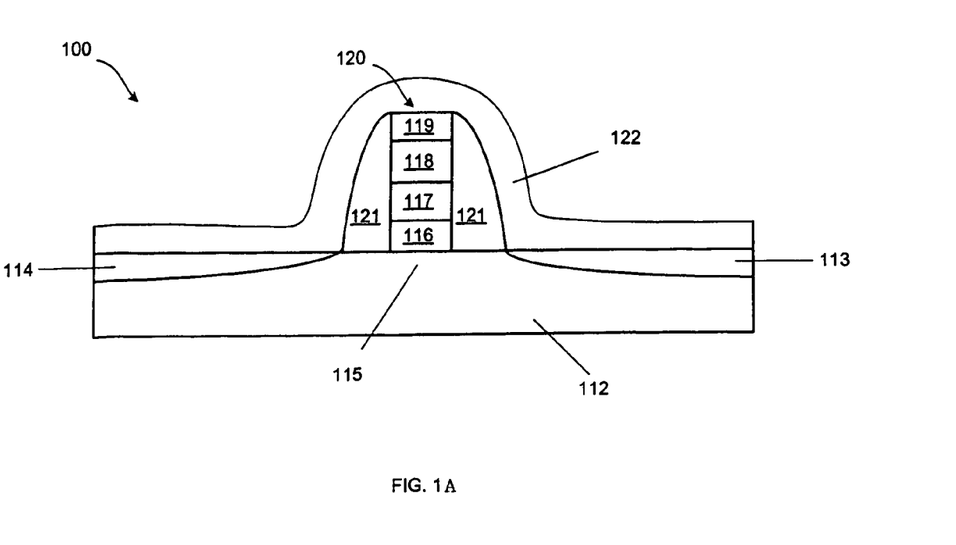
FIG. 1A schematically shows a cross-sectional view of a device containing a strained SiN film according to an embodiment of the invention.

Referring now to the drawings, FIG. 1A schematically shows a cross-sectional view of a device containing a strained SiN film according to an embodiment of the invention. The strained SiN film 122 is disposed on a MOS device 100. The device 100, as shown, also includes, besides the strained SiN film 122, a substrate 112 having doped regions 113 and 114 (e.g., source and drain), a gate stack 120, and a spacer 121. The substrate 112 can for example be a Si, Ge, SiGe, or GaAs wafer. The substrate 112 can be of any size, for example, a 200 mm substrate, a 300 mm substrate, or an even larger substrate.

The gate stack 120 includes a dielectric layer 116 on the channel region 115. The dielectric layer 116 can for example include a $SiO_2$ layer, a SiN layer, a SiON layer, or a combination thereof, or any other appropriate material. The dielectric layer 116 can further include a high-dielectric constant (high-k) dielectric material. The high-k dielectric material can for example include metal oxides and their silicates, including $Ta_2O_5$, $TiO_2$, $ZrO_2$, $Al_2O_3$, $Y_2O_3$, $HfO_xN_y$, $HfSiO_xN_y$, $HfSiO_x$, $HfO_2$, $ZrSiO_x$, $ZrO_xN_y$, $ZrSiO_xN_y$, $TaSiO_x$, $SrO_x$, $SrSiO_x$, $LaO_x$, $LaSiO_x$, $YO_x$, or $YSiO_x$, or combinations of two or more thereof.

In the embodiment of FIG. 1A, a conductive layer 117 (e.g., a gate electrode layer) is formed on the dielectric layer 116, and a silicide layer 118 is formed on the conductive layer 117 to reduce the electrical resistance of the conductive layer 117. The cap layer 119 can be positioned on top of the gate stack 120 to protect the gate stack 120. The cap layer 119 can, for example, be a SiN layer.

In one embodiment of the invention, the conductive layer 117 can be doped polycrystalline silicon (poly-Si), and the silicide layer 118 can be tungsten silicide. The gate stack 120 may include different layers, fewer layers or more layers than shown in FIG. 1A. In one example, layer 117 and/or layer 118 may be replaced by a metal gate layer. FIG. 1A further shows that spacer 121 is formed on each side of the gate stack 120 in order to protect the gate stack 120 from damage and ensure electrical performance of the gate. In addition, the spacer 121 can be used as a hard mask for the formation of the source and drain 113, 114 of the MOS device 100. Alternately, in one embodiment, more than one spacer 121 may be used. Alternatively, in another embodiment the strained SiN film may be incorporated in the spacer 121.

In one embodiment, the device 100 can be a NMOS device where the strained SiN film 122 increases channel carrier mobility through introduction of a tensile stress on the channel region 115. In another embodiment, the device 100 can be a PMOS device where the strained SiN film 122 increases channel carrier mobility through introduction of a compressive stress on the channel region 115. In the embodiment of FIG. 1, the strained SiN film 122 can also serve as a final passivation film for encapsulating and protecting the device 100. However, the strained SiN film can be incorporated into the CMOS structure in a variety of ways to produce stress on the channel region 115.

Figure 1B:
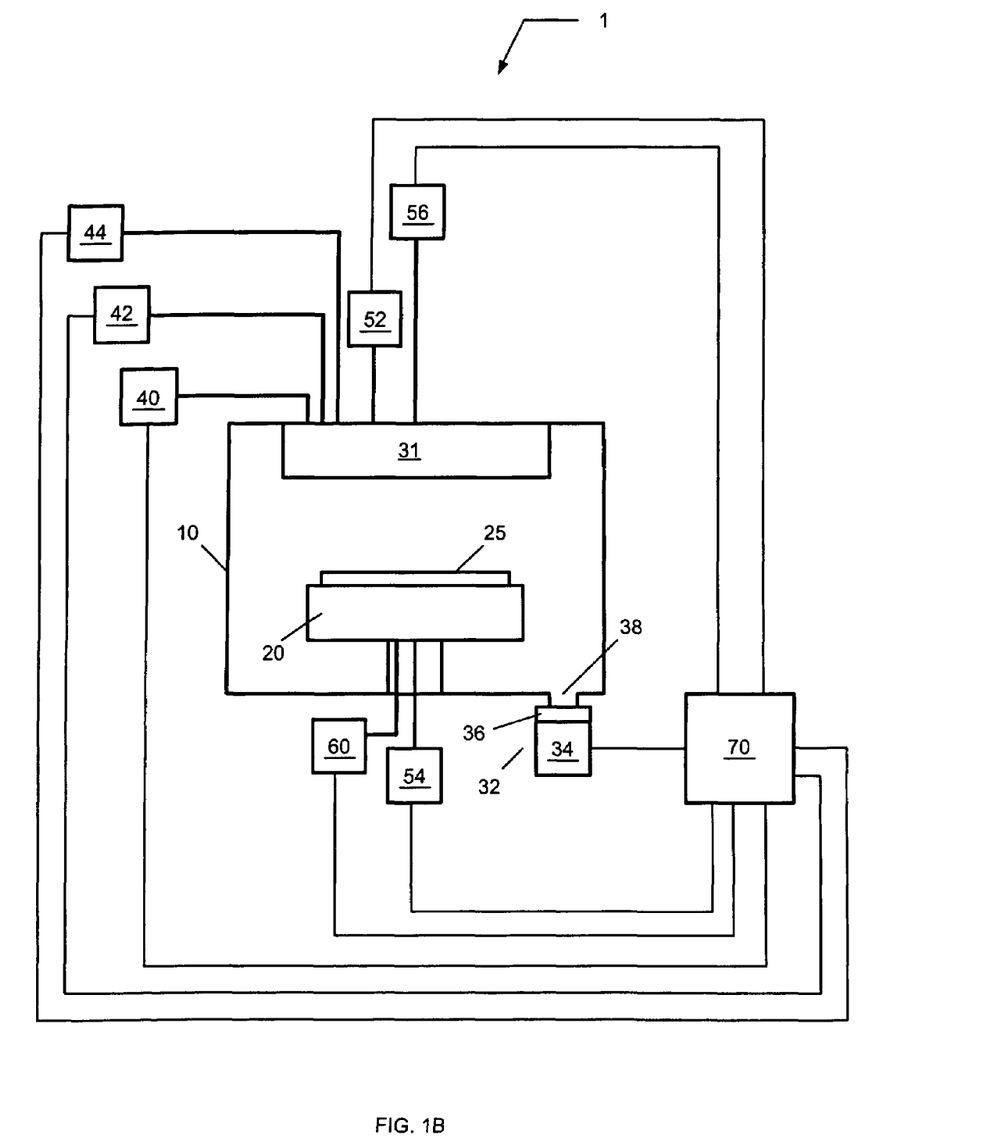
FIG. 1B illustrates a processing system for forming a strained SiN film on a substrate according to an embodiment of the invention.

FIG. 1B illustrates a processing system 1 for forming a strained SiN film on a substrate according to an embodiment of the invention. The processing system 1 can be configured to perform a PEALD process, a PECVD process, or a pulsed PECVD process, or a combination of two or more of these processes. The processing system 1 includes a process chamber 10 having a substrate holder 20 configured to support a substrate 25, upon which the strained SiN film is formed. The process chamber 10 further contains an upper assembly 31 (e.g., a showerhead) configured for introducing process gases into the process chamber 10. The upper assembly 31 is coupled to a silicon precursor gas supply system 40, a nitrogen precursor gas supply system 42, and a purge gas supply system 44. Additionally, the processing system 1 includes a substrate temperature control system 60 coupled to substrate holder 20 and configured to reduce or elevate, and control the temperature of the substrate 25. Furthermore, the processing system 1 includes a controller 70 that can be coupled to process chamber 10, substrate holder 20, upper assembly 31, silicon precursor gas supply system 40, nitrogen precursor gas supply system 42, purge gas supply system 44, and substrate temperature control system 60.

Alternatively, or in addition, controller 70 can be coupled to one or more additional controllers/computers (not shown), and controller 70 can obtain setup and/or configuration information from an additional controller/computer.

In FIG. 1B, singular processing elements (10, 20, 30, 40, 42, 44, and 60) are shown, but this is not required for the invention. The processing system 1 can include any number of processing elements having any number of controllers associated with them, in addition to independent processing elements.

The controller 70 can be used to configure any number of processing elements (10, 20, 30, 40, 42, 44, and 60), and the controller 70 can collect, provide, process, store, and display data from processing elements. The controller 70 can contain a number of applications for controlling one or more of the processing elements. For example, controller 70 can include a graphic user interface (GUI) component (not shown) that can provide easy to use interfaces that enable a user to monitor and/or control one or more processing elements.

Still referring to FIG. 1B, the processing system 1 may be configured to process 200 mm substrates, 300 mm substrates, or larger-sized substrates. In fact, it is contemplated that the processing system 1 may be configured to process substrates, wafers, or LCDs regardless of their size, as would be appreciated by those skilled in the art. Therefore, while embodiments of the invention are described in connection with the processing of a semiconductor substrate, the invention is not limited solely thereto.

The silicon precursor gas supply system 40 and the nitrogen precursor gas supply system 42 are configured to alternately or simultaneously introduce gases to process chamber 10. The alternation of the introduction of the gases can be cyclical, or it may be acyclical with variable time periods between introduction of the silicon precursor and the nitrogen precursor.

Still referring to FIG. 1B, the purge gas supply system 44 is configured to introduce a purge gas to process chamber 10. For example, the introduction of a purge gas may occur between introduction of pulses of a silicon precursor and a nitrogen precursor to the process chamber 10. The purge gas can comprise an inert gas, such as a noble gas (i.e., He, Ne, Ar, Kr, Xe), or hydrogen ($H_2$).

Furthermore, the substrate temperature control system 60 is coupled to the substrate holder 20 and configured to elevate and control the temperature of substrate 25. Substrate temperature control system 60 comprises temperature control elements, such as a cooling system including a re-circulating coolant flow that receives heat from substrate holder 20 and transfers heat to a heat exchanger system (not shown), or when heating, transfers heat from the heat exchanger system. Additionally, the temperature control elements can include heating/cooling elements, such as resistive heating elements, or thermo-electric heaters/coolers, which can be included in the substrate holder 20, as well as the chamber wall of the process chamber 10 or any other component within the processing system 1. The substrate temperature control system 60 can, for example, be configured to elevate and control the substrate temperature from room temperature to approximately 350° C. to 550° C. Alternatively, the substrate temperature can, for example, range from approximately 150° C. to 350° C. It is to be understood, however, that the temperature of the substrate is selected based on the desired temperature for causing deposition of a strained SiN film from particular silicon and nitrogen precursors on the surface of a given substrate.

In order to improve the thermal transfer between substrate 25 and substrate holder 20, substrate holder 20 can include a mechanical clamping system, or an electrical clamping system, such as an electrostatic clamping system, to affix substrate 25 to an upper surface of substrate holder 20. Furthermore, substrate holder 20 can further include a substrate backside gas delivery system configured to introduce gas to the back-side of substrate 25 in order to improve the gas-gap thermal conductance between substrate 25 and substrate holder 20. Such a system can be utilized when temperature control of the substrate is required at elevated or reduced temperatures. For example, the substrate backside gas delivery system can comprise a two-zone gas distribution system, wherein the helium gas gap pressure can be independently varied between the center and the edge of substrate 25.

Furthermore, the process chamber 10 of FIG. 1B is further coupled to a pressure control system 32, including a vacuum pumping system 34, a valve 36, and a duct 38, wherein the pressure control system 32 is configured to controllably evacuate the process chamber 10 to a pressure suitable for forming the strained SiN film on substrate 25. The vacuum pumping system 34 can include a turbo-molecular vacuum pump (TMP) or a cryogenic pump, and valve 36 can include a gate valve for throttling the chamber pressure. Moreover, a device for monitoring chamber pressure (not shown) can be coupled to the process chamber 10. The pressure measuring device can be an absolute capacitance manometer. The pressure control system 32 can, for example, be configured to control the process chamber pressure between about 0.1 Torr and about 100 Torr during deposition of the SiN film.

The silicon precursor gas supply system 40, nitrogen precursor gas supply system 42, and purge gas supply system 44 can include one or more pressure control devices, one or more flow control devices, one or more filters, one or more valves, and/or one or more flow sensors. The flow control devices can include pneumatic driven valves, electro-mechanical (solenoidal) valves, and/or high-rate pulsed gas injection valves.

According to embodiments of the invention, gases may be sequentially and alternately pulsed into the process chamber 10, where the length of each gas pulse can, for example, be between about 0.1 sec and about 100 sec. Alternately, the length of each gas pulse can be between about 1 sec and about 10 sec.

The processing system further includes a plasma generation system configured to generate a plasma during at least a portion of the gas exposures in the process chamber 10. According to one embodiment of the invention, plasma excited nitrogen may be formed from a nitrogen-containing gas containing $N_2$, $NH_3$, $N_2H_4$, or $C_1$-$C_{10}$ alkylhydrazine compounds, or a combination thereof.

The plasma generation system includes a first power source 52 coupled to the process chamber 10, and configured to couple power to gases introduced into the process chamber 10. The first power source 52 may be a variable power source and may include a radio frequency (RF) generator and an impedance match network, and may further include an electrode through which RF power is coupled to the plasma in process chamber 10. The electrode can be formed in the upper assembly 31, and it can be configured to oppose the substrate holder 20. The impedance match network can be configured to optimize the transfer of RF power from the RF generator to the plasma by matching the output impedance of the match network with the input impedance of the process chamber 10, including the electrode, and plasma. For instance, the impedance match network serves to improve the transfer of RF power to a plasma in process chamber 10 by reducing the reflected power. Match network topologies (e.g. L-type, π-type, T-type, etc.) and automatic control methods are well known to those skilled in the art.

Alternatively, the first power source 52 may include a RF generator and an impedance match network, and may further include an antenna, such as an inductive coil, through which RF power is coupled to a plasma in process chamber 10. The antenna can, for example, include a helical or solenoidal coil, such as in an inductively coupled plasma source or helicon source, or it can, for example, include a flat coil as in a transformer coupled plasma source.

Still alternatively, the first power source 52 may include a microwave frequency generator, and may further include a microwave antenna and microwave window through which microwave power is coupled to plasma in process chamber 10. The coupling of microwave power can be accomplished using electron cyclotron resonance (ECR) technology, or it may be employed using surface wave plasma technology, such as a slotted plane antenna (SPA), as described in U.S. Pat. No. 5,024,716, the entire content of which is incorporated herein by reference.

According to one embodiment of the invention, the processing system 1 includes a substrate bias generation system configured to generate or assist in generating a plasma (through biasing of substrate holder 20) during at least a portion of the alternating introduction of the gases to the process chamber 10. The substrate bias generating system can include a substrate power source 54 coupled to the process chamber 10, and configured to couple power to the substrate 25. The substrate power source 54 may include a RF generator and an impedance match network, and may further include an electrode through which RF power is coupled to substrate 25. The electrode can be formed in substrate holder 20. For instance, substrate holder 20 can be electrically biased at a RF voltage via the transmission of RF power from a RF generator (not shown) through an impedance match network (not shown) to substrate holder 20. A typical frequency for the RF bias can range from about 0.1 MHz to about 100 MHz, and can be 13.56 MHz. RF bias systems for plasma processing are well known to those skilled in the art. Alternatively, RF power is applied to the substrate holder electrode at multiple frequencies. Although the plasma generation system and the substrate bias system are illustrated in FIG. 1B as separate entities, they may indeed comprise one or more power sources coupled to substrate holder 20.

In addition, the processing system 1 includes a remote plasma system 56 for providing and remotely plasma exciting a gas (e.g., a nitrogen precursor) prior to flowing the plasma excited gas into the process chamber 10 where it is exposed to the substrate 25. The remote plasma system 56 can, for example, contain a microwave frequency generator.

Still referring to FIG. 1B, controller 70 can comprise a microprocessor, memory, and a digital I/O port capable of generating control voltages sufficient to communicate and activate inputs to the processing system 1 as well as monitor outputs from the processing system 1. Moreover, the controller 70 may be coupled to and may exchange information with the process chamber 10, substrate holder 20, upper assembly 31, silicon precursor gas supply system 40, nitrogen precursor gas supply system 42, purge gas supply system 44, substrate temperature control system 60, pressure control system 32, substrate power source 54, remote plasma system 56, and first power source 52. For example, a program stored in the memory may be utilized to activate the inputs to the aforementioned components of the processing system 1 according to a process recipe in order to perform a deposition process. One example of the controller 70 is a DELL PRECISION WORKSTATION 610™, available from Dell Corporation, Austin, Tex.

However, the controller 70 may be implemented as a general purpose computer system that performs a portion or all of the microprocessor based processing steps of the invention in response to a processor executing one or more sequences of one or more instructions contained in a memory. Such instructions may be read into the controller memory from another computer readable medium, such as a hard disk or a removable media drive. One or more processors in a multi-processing arrangement may also be employed as the controller microprocessor to execute the sequences of instructions contained in main memory. In alternative embodiments, hard-wired circuitry may be used in place of or in combination with software instructions. Thus, embodiments are not limited to any specific combination of hardware circuitry and software.

The controller 70 includes at least one computer readable medium or memory, such as the controller memory, for holding instructions programmed according to the teachings of the invention, and for containing data structures, tables, records, or other data that may be necessary to implement the present invention. Examples of computer readable media are compact discs, hard disks, floppy disks, tape, magneto-optical disks, PROMs (EPROM, EEPROM, flash EPROM), DRAM, SRAM, SDRAM, or any other magnetic medium, compact discs (e.g., CD-ROM), or any other optical medium, punch cards, paper tape, or other physical medium with patterns of holes, a carrier wave (described below), or any other medium from which a computer can read.

Stored on any one, or on a combination, of computer readable media is software for controlling the controller 70, for driving a device or devices for implementing the invention, and/or for enabling the controller to interact with a human user. Such software may include, but is not limited to, device drivers, operating systems, development tools, and applications software. Such computer readable media further includes the computer program product of the present invention for performing all or a portion (if processing is distributed) of the processing performed in implementing the invention.

The computer code devices may be any interpretable or executable code mechanism, including but not limited to scripts, interpretable programs, dynamic link libraries (DLLs), Java classes, and complete executable programs. Moreover, parts of the processing of the present invention may be distributed for better performance, reliability, and/or cost.

The term "computer readable medium" as used herein refers to any medium that participates in providing instructions to the processor of the controller 70 for execution. A computer readable medium may take many forms, including but not limited to, non-volatile media, volatile media, and transmission media. Non-volatile media includes, for example, optical, magnetic disks, and magneto-optical disks, such as the hard disk or the removable media drive. Volatile media includes dynamic memory, such as the main memory. Moreover, various forms of computer readable media may be involved in carrying out one or more sequences of one or more instructions to processor of controller for execution. For example, the instructions may initially be carried on a magnetic disk of a remote computer. The remote computer can load the instructions for implementing all or a portion of the present invention remotely into a dynamic memory and send the instructions over a network to the controller 70.

The controller 70 may be locally located relative to the processing system 1, or it may be remotely located relative to the processing system 1. For example, the controller 70 may exchange data with the processing system 1 using at least one of a direct connection, an intranet, the Internet and a wireless connection. The controller 70 may be coupled to an intranet at, for example, a customer site (i.e., a device maker, etc.), or it may be coupled to an intranet at, for example, a vendor site (i.e., an equipment manufacturer). Additionally, for example, the controller 70 may be coupled to the Internet. Furthermore, another computer (i.e., controller, server, etc.) may access, for example, the controller 70 to exchange data via at least one of a direct connection, an intranet, and the Internet. As also would be appreciated by those skilled in the art, the controller 70 may exchange data with the processing system 1 via a wireless connection.

Alternately, a batch processing system capable of processing multiple substrates simultaneously may be utilized for forming the strained SiN films described in the embodiments of the invention.

Figure 2A:
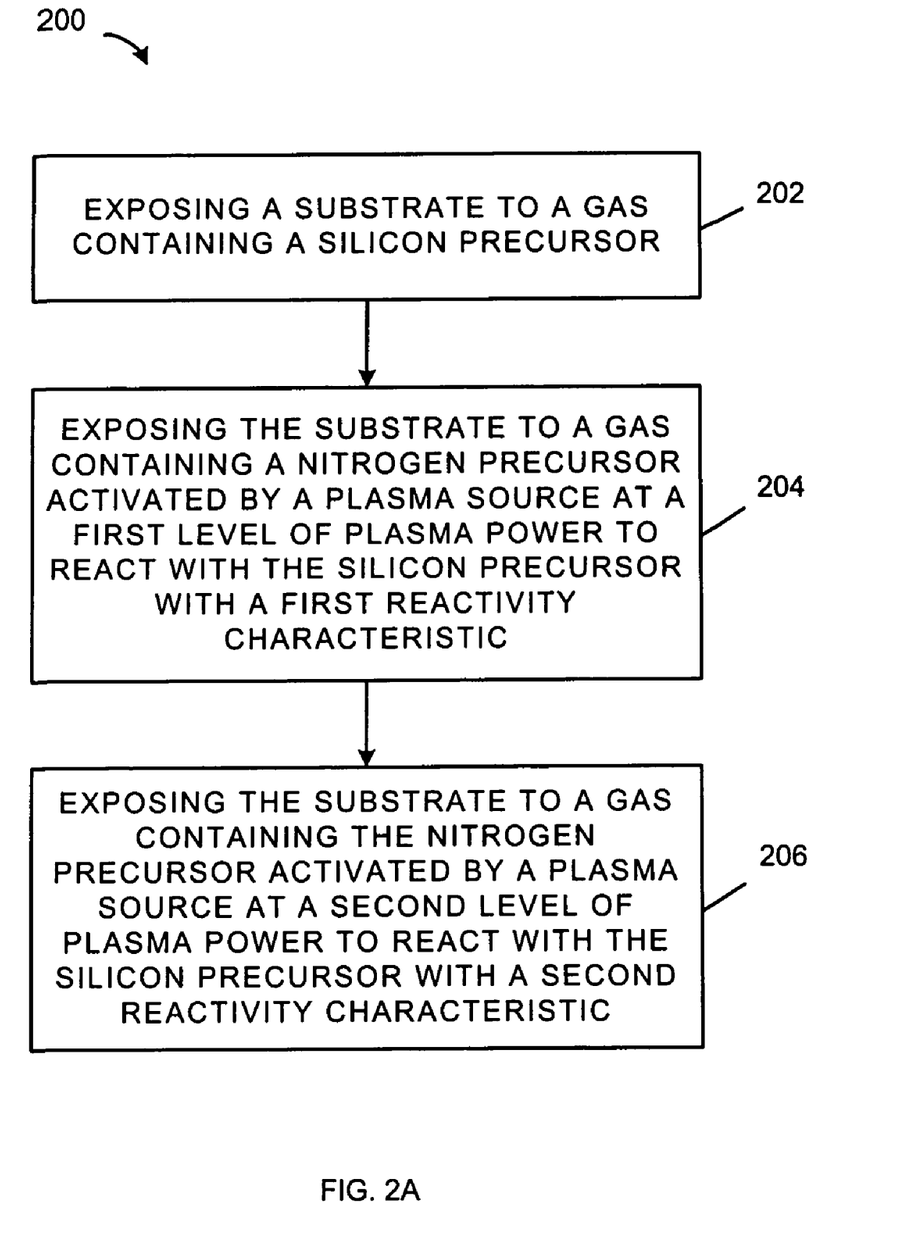
FIGS. 2A-2E are process flow diagrams for forming a strained SiN film according to embodiments of the present invention.

FIG. 2A is a process flow diagram for forming a strained SiN film on a substrate in a process chamber according to an embodiment of the present invention. The process of FIG. 2A may be performed to form a CMOS structure such as that shown in of FIG. 1A, for example, and may be performed in a processing system such as the processing system 1 of FIG. 1B, for example. As seen in FIG. 2A, the process begins in step 202 with exposing the substrate to a gas containing a silicon precursor. The silicon precursor can, for example, include silane, disilane, monochlorosilane, dichlorosilane, trichlorosilane, hexachlorodisilane, diethylsilane, and alkylaminosilane compounds. Examples of alkylaminosilane compounds include, but are not limited to, di-isopropylaminosilane ($H_3Si(NiPr_2)$), bis(diethylamino)silane ($H_2Si(NEt_2)_2$, bis(diisopropylamino)silane ($H_2Si(NiPr_2)_2$), tris(isopropylamino)silane ($HSi(NiPr_2)_3$), bis(tert-butylamino)silane (($tBu(H)N)_2SiH_2$), tetrakis(dimethylamino)silane ($Si(NMe_2)_4$), tetrakis(ethylmethylamino)silane ($Si(NEtMe)_4$), tetrakis(diethylamino)silane ($Si(NEt_2)_4$), tris(dimethylamino)silane ($HSi(NMe_2)_3$), tris(ethylmethylamino)silane ($HSi(NEtMe)_3$), tris(diethylamino)silane ($HSi(NEt_2)_3$), and tris(dimethylhydrazino)silane ($HSi(N(H)NMe_2)_3$). The gas pulse of the silicon precursor can further contain an inert gas such as Ar.

In step 204, the substrate is exposed to a gas containing a nitrogen precursor activated by a plasma source at a first level of plasma power and configured to react with the silicon precursor with a first reactivity characteristic. In one embodiment, the first level of plasma power is less than a plasma activation power (e.g., 0 W) and therefore a plasma is not activated. The plasma activation of the nitrogen precursor affects a property of a SiN film formed on the substrate, for example the deposition rate and the density of the SiN film. The plasma activated nitrogen precursor may react with the silicon precursor within a processing space of the chamber, or with silicon precursor adsorbed on a surface of the substrate, or both. The nitrogen precursor can, for example, be selected from $N_2$, $NH_3$, $N_2H_4$, and $C_1$-$C_{10}$ alkylhydrazine compounds. The gas can further contain an inert gas such as Ar.

In step 206, the substrate is exposed to a gas containing the nitrogen precursor activated by the plasma source at a second level of plasma power to react with the silicon precursor with a second reactivity characteristic different than the first reactivity characteristic.

Plasma activation of a nitrogen precursor (or other precursors) can result in electronic excitation and/or ionization of the nitrogen precursor that affects reactivity towards a metal precursor. In addition, plasma activation can result in at least partial dissociation of the nitrogen precursor, thereby creating a modified nitrogen precursor with a different reactivity towards the metal precursor. Increasing the level of plasma power and plasma density, for example, will generally increase the amount of electronically excited, ionized, and at least partially dissociated nitrogen precursor. In addition, increased levels of plasma power and plasma density may be utilized to vary the concentration of additional charged species (e.g., Argon ions, electrons, or both) in the plasma environment. These additional charged species may interact with the metal nitride film and the substrate during deposition, thereby affecting a reactivity characteristic and a property (e.g., density, strain) of at least a portion of a thickness of the metal nitride film.

The steps of the process 200 depicted in FIG. 2A can be continued for a predetermined time or repeated a predetermined number of times until a strained SiN film with a desired thickness has been deposited onto the substrate. Further, the sequence of steps 202, 204 and 206 of the process 200 can vary widely in accordance with embodiments of the invention. For example, the silicon precursor and the plasma activated nitrogen precursor can be provided in the process chamber as discrete gas pulses having no temporal overlap, where the level of plasma power is varied for the discrete gas pulses. Alternatively, the silicon precursor and the nitrogen precursor may be flowed continuously while simply varying the level of plasma power. Some combination of these methods may also be used. For example, the silicon precursor can be continuously provided to the chamber while the nitrogen precursor and the plasma are pulsed at different levels of plasma power, or both the silicon and the nitrogen precursor can be continuously provided and the plasma is pulsed at different levels of plasma power. As would be understood by one of ordinary skill in the art, various combinations are possible, and embodiments of the invention are not limited by the specific examples described in FIGS. 2A-2E herein.

Thus, the present inventors have discovered that exposing the substrate to a nitrogen precursor having different reactivity characteristics toward the silicon precursor can cause a strain in the SiN layer. Therefore, a strained SiN layer can be formed as the SiN layer is deposited, rather than by the conventional method of post processing. Thus, embodiments of the present invention may reduce production time and equipment necessary for forming a strained SiN film. Further, the strain provided during forming of the SiN film may be better controlled than that of post processing methods. For example, a predetermined strain gradient throughout the SiN film (rather than in only a surface region) can be provided by a particular process recipe for forming the strained SiN film. In particular, processing conditions such the type of plasma activation and the level of plasma power used for the activation and exposure time can be set to provide a predetermined strain in the SiN film.

Still further, embodiments of the invention allow forming of the strained SiN film using PEALD, PECVD, or pulsed PECVD processes, as will be discussed below. In this regard, reduced production time resulting from providing the strain during formation of the SiN layer may allow a strained SiN film to be formed by an ALD process in less time than conventional CVD and post processing processes. Further, the invention may also provide better control of thickness and conformality of the SiN layer than CVD methods currently in practice.

Figure 2B:
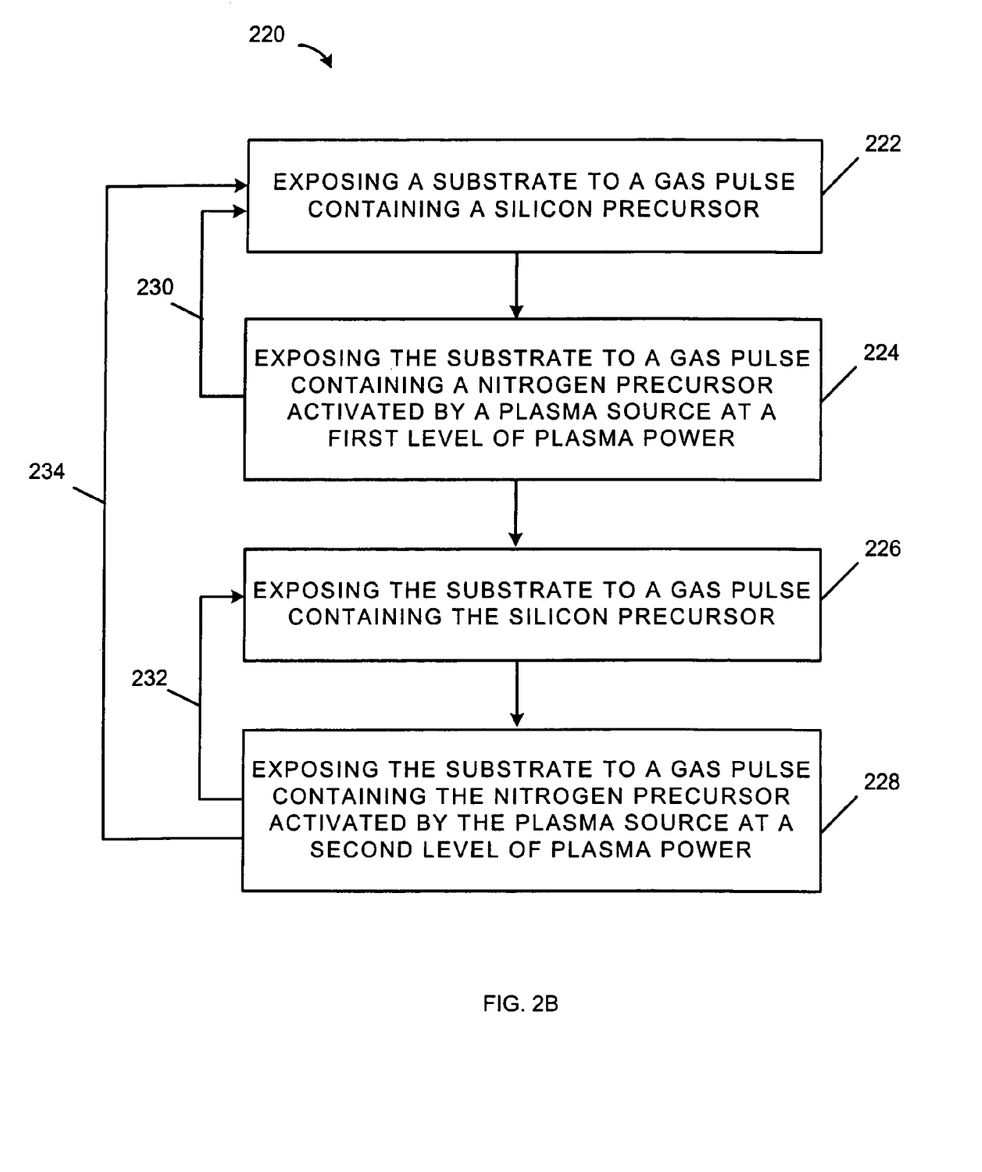

FIG. 2B is a process flow diagram for forming a strained SiN film according to an embodiment of the invention. The process 220 is a PEALD process and includes sequential gas exposures of a silicon precursor and a plasma activated nitrogen precursor with partial or no temporal overlap between the different gas pulses.

The process 220 includes, in step 222, exposing a substrate to a gas pulse containing a silicon precursor and optionally an inert gas such as Ar. In step 224, the substrate is exposed to a gas pulse containing a nitrogen precursor activated by a plasma source at a first level of plasma power. In step 226, the substrate is exposed to a second gas pulse containing the silicon precursor. In step 228, the substrate is exposed to a gas pulse containing the nitrogen precursor activated by the plasma source at a second level of plasma power.

Figure 3A:
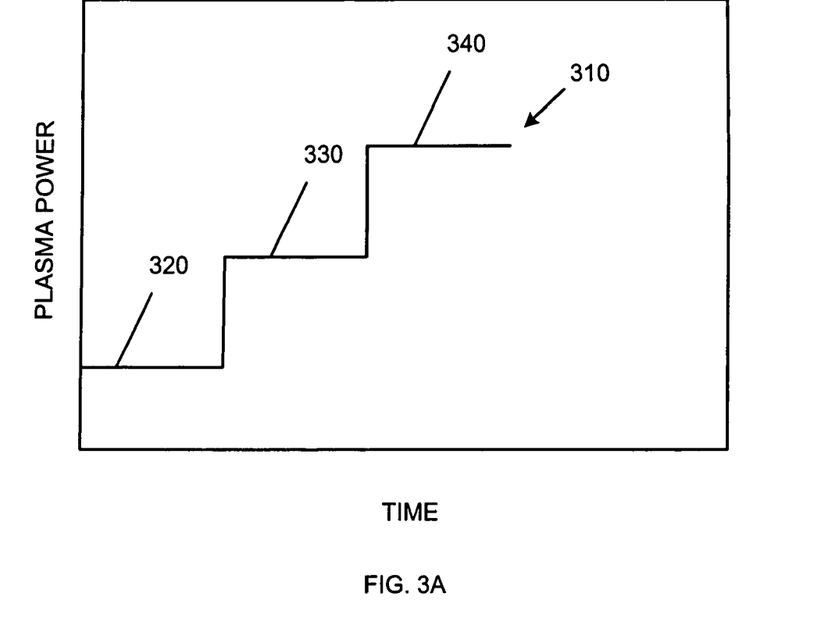
FIGS. 3A and 3B show power graphs depicting different levels of plasma power coupled to a process chamber in accordance with embodiments of the invention.
Figure 3B:
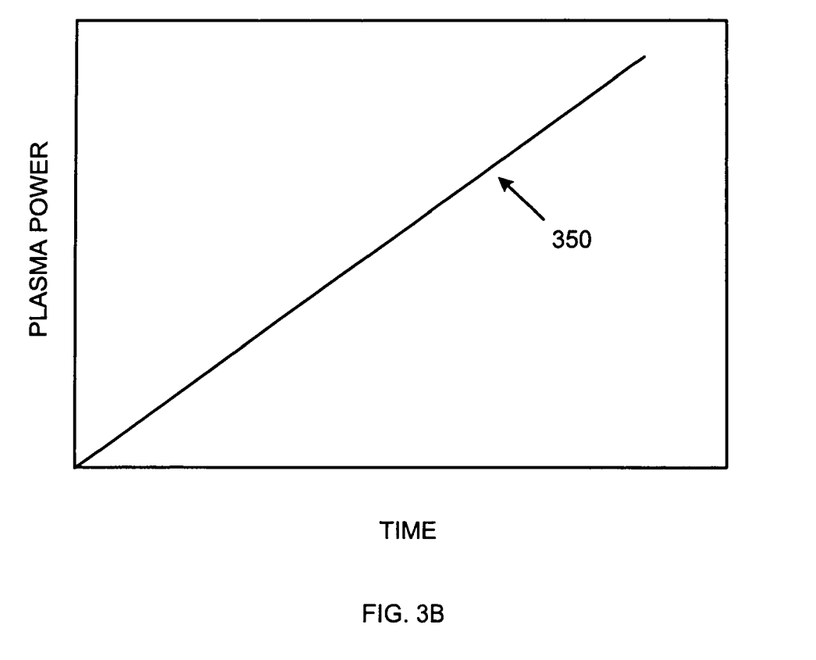

FIGS. 3A and 3B show power graphs depicting different levels of plasma power coupled to a process chamber in accordance with embodiments of the invention. As shown by the exemplary power curve 310 in FIG. 3A, the level of plasma power may be applied to the process chamber in a plurality discrete levels, 320, 330, and 340. In one example, the power level 320 may be at or below a lower limit for plasma formation and the power level 340 may correspond to a maximum desired level of plasma power. The maximum desired level of plasma power is preferably not higher than a level determined to disrupt or damage the substrate including any deposited films thereon. As seen in FIG. 3B, the level of plasma power may be applied to the process chamber in a continuously changing fashion represented by the power curve 350.

As would be understood by one of ordinary skill in the art, the power curves of FIGS. 3A and 3B are exemplary, and the varying level of plasma power may depend on the composition and characteristic of the film to be deposited by the process. For example, the plasma power of FIG. 3A can include more than three (3) discrete levels of plasma power, and the plasma power of FIG. 3B may change in a non-linear fashion. Moreover, a combination of stepped and ramped power can be used to vary the level of plasma power. Further, the power may be provided in discrete pulses where power is on or off. Still further, suitable high levels of plasma power that enable deposition of a film at improved deposition speeds and with reduced impurities in accordance with an embodiment of the invention can be determined by direct experimentation and/or design of experiments (DOE). Other adjustable process parameters such as substrate temperature, process pressure, type of process gas and relative gas flows can also be determined by direct experimentation and/or DOE.

Referring back to FIG. 2B, steps 222-228 may be repeated a predetermined number of times as shown by the process flow 234 until a strained SiN film with a desired thickness has been deposited onto the substrate. The process chamber may be purged with an inert gas, evacuated, or both purged and evacuated after each of steps 222, 224, 226, and 228.

According to one embodiment, steps 222 and 224 may be sequentially performed a first number of times as shown by the process flow 230, prior to performing steps 226 and 228.

According to another embodiment, steps 226 and 228 may be sequentially performed a second number of times as shown by the process flow 232, prior to repeating steps 222 and 224 in the process flow 234.

According to yet another embodiment, steps 222 and 224 may be sequentially performed a first number of times prior to performing steps 226 and 228 as shown by the process flow 230, and steps 226 and 228 may be sequentially performed a second number of times as shown by the process flow 232, prior to repeating steps 222 and 224 in the process flow 234. In this regard, it is to be understood that the terms "a first number of times" and "a second number of times" are used to provide different terms for ease of understanding. However, the first and second number of times can be the same or a different number.

According to one embodiment, the first number of times may decrease monotonically and the second number of times may increase monotonically each time process flow 234 is performed. In one example, in step 222, the substrate is exposed to a gas pulse containing a silicon precursor, in step 224, the substrate is exposed to a gas pulse containing a nitrogen precursor activated by a plasma source at a first level of plasma power, and steps 222 and 224 are repeated twice using the process flow 230. Thereafter, in step 226, the substrate is exposed to a gas pulse containing the silicon precursor, and in step 228, the substrate is exposed to a gas pulse containing the nitrogen precursor activated by the plasma source at a second level of plasma power. Next, in step 222, the substrate is exposed to a gas pulse containing the silicon precursor, in step 224, the substrate is exposed to a gas pulse containing the nitrogen precursor activated by the plasma source at the first level of plasma, power, and steps 222 and 224 are repeated once using the process flow 230. Thereafter, in step 226, the substrate is exposed to a gas pulse containing the silicon precursor, in step 228, the substrate is exposed to a gas pulse containing the nitrogen precursor activated by the plasma source at a second level of plasma power, and steps 226 and 228 are repeated once using the process flow 232. Next, in step 222, the substrate is exposed to a gas pulse containing the silicon precursor, and in step 224, the substrate is exposed to a gas pulse containing the nitrogen precursor activated by the plasma source at the first level of plasma power. Thereafter, in step 226, the substrate is exposed to a gas pulse containing the silicon precursor, in step 228, the substrate is exposed to a gas pulse containing the nitrogen precursor activated by the plasma source at a second level of plasma power, and steps 226 and 228 are repeated twice using process flow 232. In this example, the first number of times decreases from 3 to 2 to 1 and the second number of times increases from 1 to 2 to 3 during deposition of the strained SiN film.

Still referring to FIG. 2B, according to one embodiment of the invention, the gas pulse in step 224 may further comprise a dilution gas in a first ratio with the nitrogen precursor, and the gas pulse in step 228 may further comprise the dilution gas in a second ratio with the nitrogen precursor, where the second ratio is different from the first ratio. The addition of a dilution gas to a nitrogen precursor can affect the plasma density in the process chamber and thus the amount of activated nitrogen precursor available to interact with the silicon precursor. The dilution gas may be selected from He, Ar, Ne, Kr, Xe, or $H_2$, or a combination of two or more thereof. The first and second ratios may, for example, be defined as D/N or D/(D+N), where D and N refer to the amounts of the dilution gas and the nitrogen precursor, respectively. According to one embodiment, the first and/or second ratios may be varied from a ratio corresponding to substantially pure nitrogen precursor, to another ratio corresponding to a combination of the dilution gas and the nitrogen precursor, to yet another ratio corresponding to substantially pure dilution gas. In one example, a ratio D/(D+N) may increase monotonically as 0, 0.05, 0.10, . . . , 0.90, 0.95, and 1.0, for example during deposition of the SiN film.

Figure 2C:
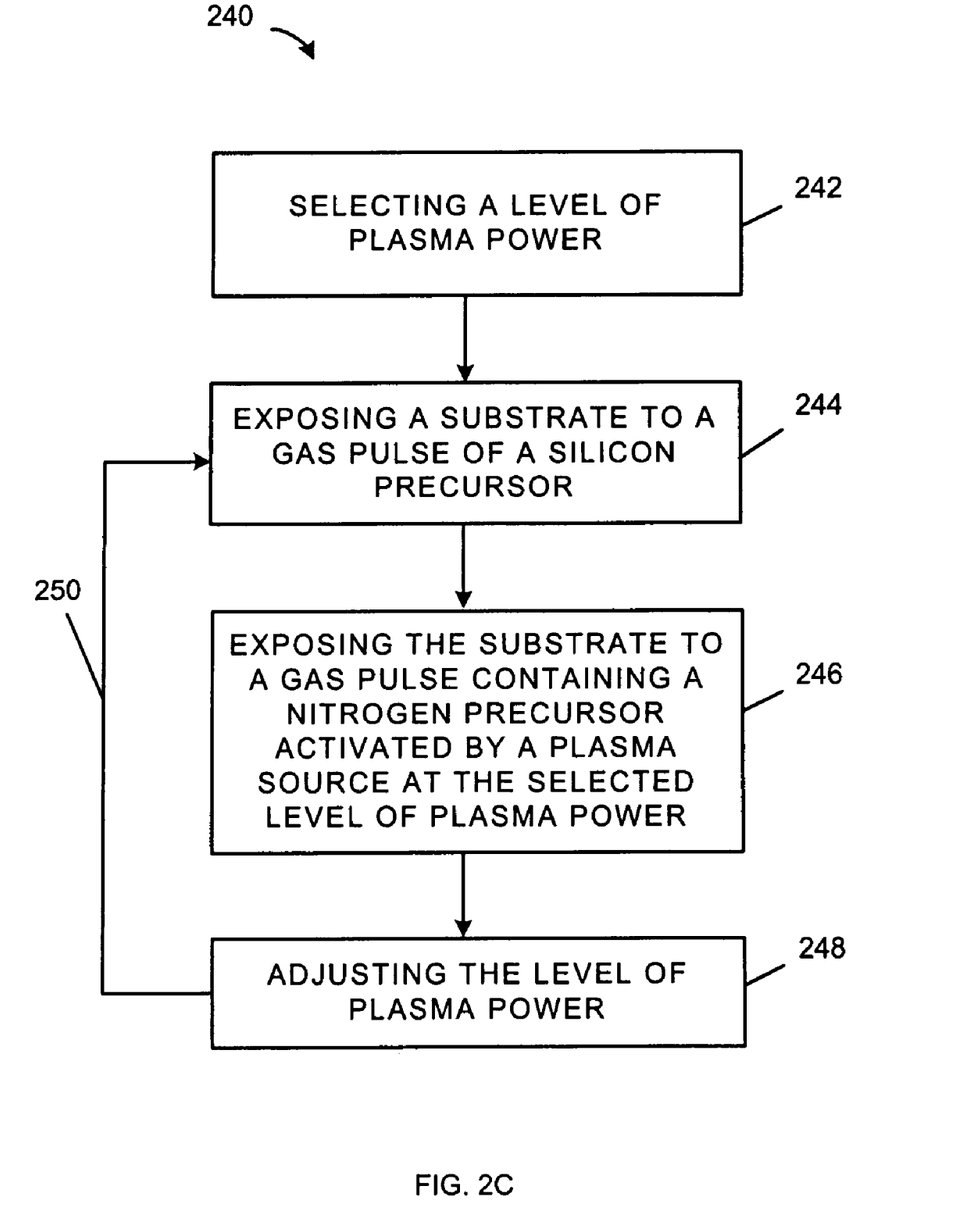

FIG. 2C is a process flow diagram for forming a strained SiN film according to another embodiment of the present invention. The process 240 includes, in step 242, selecting a level of plasma power. The level of plasma power can range from a first level at or below a lower limit for plasma formation to a second level of plasma power corresponding to a maximum desired level of plasma power. Thus, the first level of plasma power can be 0 W of plasma power. In step 244, the substrate is exposed to a gas pulse containing a silicon precursor, and in step 246, the substrate is exposed to a gas pulse containing a nitrogen precursor activated by the plasma source at the selected level of plasma power. In step 248, the level of plasma power is adjusted, and step 244 is repeated as shown by the process flow 250. According to one embodiment, the level of plasma power can monotonically increase or decrease during deposition of the SiN film. The process 240 may be performed as a pulsed PECVD process that includes interrupted gas exposures of a silicon precursor and a plasma activated nitrogen precursor with at least partial temporal overlap of the gas pulses in steps 244 and 246. Alternately, the process 240 may be performed as a PEALD process with no overlap of the gas pulses in steps 244 and 246.

Still referring to FIG. 2C, according to one embodiment of the invention, the gas pulse in step 246 may further comprise a dilution gas in a first ratio with the nitrogen precursor, and step 248 may further comprise adjusting the amount of dilution gas from the first ratio to a second ratio different from the first ratio.

Figure 2D:
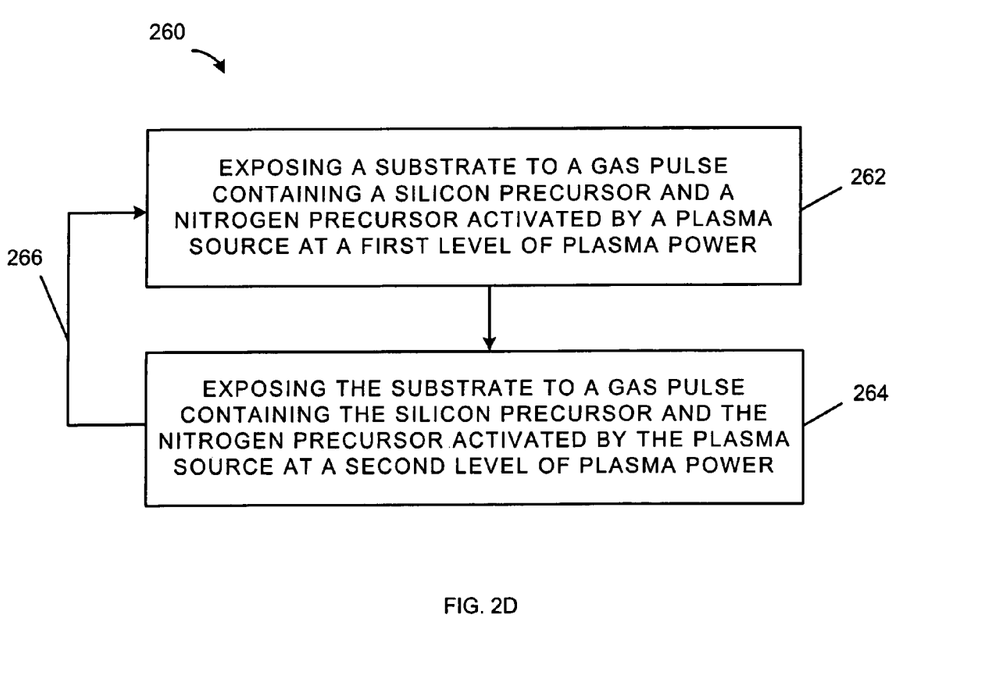

FIG. 2D is a process flow diagram for forming a strained SiN film according to another embodiment of the invention. The process 260 includes, in step 262, exposing a substrate to a gas pulse containing a silicon precursor and a nitrogen precursor activated by a plasma source at a first level of plasma power. In step 264, the substrate is exposed to a gas pulse containing the silicon precursor and the nitrogen precursor activated by the plasma source at a second level of plasma power different from the first level of plasma power. According to one embodiment of the invention, the gas pulse in step 262 may further comprise a dilution gas in a first ratio with the nitrogen precursor and the gas pulse in step 264 may further comprise the dilution gas in a second ratio with the nitrogen precursor, where the second ratio is different from the first ratio.

Figure 2E:
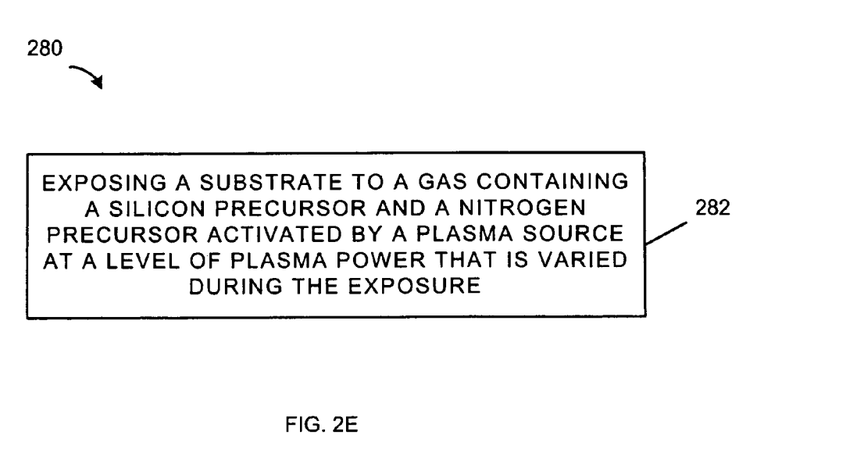

FIG. 2E is a process flow diagram for forming a strained SiN film according to another embodiment of the present invention. The process 280 includes, in step 282, exposing a substrate to a gas containing a silicon precursor and a nitrogen precursor activated by a plasma source at a level of plasma power that is varied during the exposure. In one example the level of plasma power can monotonically increase or decrease during deposition of the SiN film. According to one embodiment of the invention, the gas pulse in step 282 may further comprise a dilution gas in a ratio with the nitrogen precursor where the ratio is varied during the exposure. In one example the ratio can monotonically increase or decrease during deposition of the SiN film.

While the invention has been illustrated by the description of several embodiments thereof, and while the embodiments have been described in considerable detail, they are not intended to restrict or in any way limit the scope of the appended claims to such detail. Additional advantages and modifications will readily appear to those skilled in the art. The invention in its broader aspects is therefore not limited to the specific details, representative systems and method and illustrative examples shown and described. For example, while embodiments of the invention are described with respect to varying the plasma power to provide different reactivity characteristics with respect to the same nitrogen precursor and the same silicon precursor, the invention is not limited to such description. Specifically, the feature of varying plasma power may be using in combination with changing the nitrogen precursor type and/or changing the silicon precursor type to provide different reactivity characteristics in order to deposit a strained SiN film. Accordingly, departures may be made from such details without departing from the scope of the general inventive concept.

What is claimed is:

1. A method of depositing a strained SiN film on a substrate in a process chamber, comprising:
    exposing the substrate to a gas comprising a silicon precursor; thereafter
    exposing the substrate to a gas comprising a nitrogen precursor activated by a plasma source at a first level of plasma power and configured to react with the silicon precursor with a first reactivity characteristic to at first react the silicon precursor with the nitrogen precursor; and
    exposing the substrate to a gas comprising the nitrogen precursor activated by the plasma source at a second level of plasma power different from the first level and configured to react with the silicon precursor with a second reactivity characteristic such that a property of the SiN film formed on the substrate changes to provide the strained SiN film.

2. The method of claim 1, wherein the nitrogen precursor is selected from $N_2$, $NH_3$, $N_2H_4$, and $C_1$-$C_{10}$ alkyl hydrazine compounds.

3. The strained SiN film deposited according to claim 1.

4. The method of claim 1, comprising:
    a) exposing the substrate to a gas pulse comprising the silicon precursor; thereafter
    b) exposing the substrate to a gas pulse comprising the nitrogen precursor activated by the plasma source at the first level of plasma power; thereafter
    c) exposing the substrate to a gas pulse comprising the silicon precursor; thereafter
    d) exposing the substrate to a gas pulse comprising the nitrogen precursor activated by the plasma source at the second level of plasma power; and
    e) repeating steps a) d) a predetermined number of times.

5. The method of claim 4, further comprising sequentially performing steps a) and b) a first number of times prior to performing steps c) and d).

6. The method of claim 4, further comprising sequentially performing steps c) and d) a second number of times prior to repeating steps a) and b) in step e).

7. The method of claim 4, further comprising purging or evacuating, or both purging and evacuating the process chamber after each of steps a) d).

8. The method of claim 4, wherein steps a) and b) have at least partial temporal overlap.

9. The method of claim 4, wherein steps c) and d) have at least partial temporal overlap.

10. The method of claim 4, wherein steps a) and b) have at least partial temporal overlap and steps c) and d) have at least partial temporal overlap.

11. The method of claim 4, further comprising sequentially performing steps a) and b) a first number of times prior to performing steps c) and d), and sequentially performing steps c) and d) a second number of times prior to repeating steps a) and b) in step e).

12. The method of claim 11, wherein step e) further comprises varying the first number of times or the second number of times, or both the first and second number of times during deposition of the strained SiN film.

13. The method of claim 4, wherein the first level of plasma power or the second level of plasma power, or both first and second levels of plasma power are varied during deposition of the strained SiN film.

14. The method of claim 13, wherein the first level of plasma power or the second level of plasma power, or both first and second levels of plasma power are between a lower level of plasma power at or below a lower limit for plasma formation and an upper level of plasma power corresponding to a maximum desired level of plasma power.

15. The method of claim 1, wherein the silicon precursor comprises silane, disilane, monochlorosilane, dichlorosilane, trichlorosilane, hexachlorodisilane, diethylsilane, or an alkylaminosilane, or a combination of two or more thereof.

16. The method of claim 15, wherein the alkylaminosilane comprises di-isopropylaminosilane ($H_3Si(NiPr_2)$), bis(diethylamino)silane ($H_2Si(NEt_2)_2$, bis(diisopropylamino)silane ($H_2Si(NiPr_2)_2$, tris(isopropylamino)silane (HSi(NiPr_2)_3$), bis(tert-butylamino)silane (($tBu(H)N)_2SiH_2$), tetrakis(dimethylamino)silane ($Si(NMe_2)_4$), tetrakis(ethylmethylamino)silane ($Si(NEtMe)_4$), tetrakis(diethylamino)silane ($Si(NEt_2)_4$), tris(dimethylamino)silane ($HSi(NMe_2)_3$), tris(ethylmethylamino)silane ($HSi(NEtMe)_3$), tris(diethylamino)silane ($HSi(NEt_2)_3$), or tris(dimethylhydrazino)silane ($HSi(N(H)NMe_2)_3$), or a combination of two or more thereof.

17. The method of claim 1, wherein the exposing the substrate to a gas comprising a nitrogen precursor activated by a plasma source at a first level of plasma power further comprises providing a dilution gas in a first dilution ratio with the nitrogen precursor, and wherein the exposing the substrate to a gas comprising the nitrogen precursor activated by the plasma source at a second level of plasma power further comprises providing the dilution gas in a second dilution ratio with the nitrogen precursor different from the first dilution ratio.

18. The method of claim 17, wherein the dilution gas is selected from He, Ar, Ne, Kr, Xe, or $H_2$, or a combination of two or more thereof.

19. A method of depositing a strained SiN film on a substrate in a process chamber, comprising:
    exposing the substrate to a gas pulse comprising a silicon precursor; thereafter
    exposing the substrate to a gas pulse comprising a nitrogen precursor activated at a level of plasma power; and,
    varying the level of plasma power during the plasma exposure to change a reactivity of the nitrogen precursor and the silicon precursor.

20. The method of claim 19, wherein the level of plasma power is varied between a first level of plasma power at or below a lower limit for plasma formation and a second level of plasma power corresponding to a maximum desired level of plasma power.

21. The method of claim 19, wherein the level of plasma power is varied monotonically during the deposition of the SiN film.

22. The method of claim 19, wherein the gas pulse further comprises dilution gas selected from He, Ar, Ne, Kr, Xe, or $H_2$, or a combination of two or more thereof.

23. The strained SiN film deposited according to claim 19.

24. The method of claim 19, wherein the nitrogen precursor is selected from $N_2$, $NH_3$, $N_2H_4$, and $C_1$-$C_{10}$ alkyl hydrazine compounds.

25. The method of claim 22, wherein a ratio of the dilution gas and the nitrogen precursor is varied during the exposure.

26. The method of claim 19, wherein the silicon precursor comprises silane, disilane, monochlorosilane, dichlorosilane, trichlorosilane, hexachlorodisilane, diethylsilane, or an alkylaminosilane, or a combination of two or more thereof.

27. The method of claim 26, wherein the alkylaminosilane comprises di-isopropylaminosilane ($H_3Si(NiPr_2)$), bis(diethylamino)silane ($H_2Si(NEt_2)_2$, bis(diisopropylamino)silane ($H_2Si(NiPr_2)_2$, tris(isopropylamino)silane (HSi(NiPr_2)_3$), bis(tert-butylamino)silane (($tBu(H)N)_2SiH_2$), tetrakis(dimethylamino)silane ($Si(NMe_2)_4$), tetrakis(ethylmethylamino)silane ($Si(NEtMe)_4$, tetrakis(diethylamino)silane ($Si(NEt_2)_4$), tris(dimethylamino)silane ($HSi(NMe_2)_3$), tris(ethylmethylamino)silane ($HSi(NEtMe)_3$), tris(diethylamino)silane ($HSi(NEt_2)_3$), or tris(dimethylhydrazino)silane ($HSi(N(H)NMe_2)_3$), or a combination of two or more thereof.

* * * * *

UNITED STATES PATENT AND TRADEMARK OFFICE
CERTIFICATE OF CORRECTION

| | | |
|---|---|---|
| PATENT NO. | : 7,651,961 B2 | Page 1 of 1 |
| APPLICATION NO. | : 11/730288 | |
| DATED | : January 26, 2010 | |
| INVENTOR(S) | : Robert D. Clark | |

It is certified that error appears in the above-identified patent and that said Letters Patent is hereby corrected as shown below:

Column 14, line 64, change "steps a) d)" to -- steps a) - d) --

Column 15, line 6, change "steps a) d)" to -- steps a) - d) --

Column 16, line 15, delete "; and," and replace with -- ; and --

Signed and Sealed this
First Day of March, 2011

David J. Kappos
*Director of the United States Patent and Trademark Office*